United States Patent
Shi et al.

(10) Patent No.: US 11,367,700 B2
(45) Date of Patent: Jun. 21, 2022

(54) ELECTRONIC PACKAGE, TERMINAL AND METHOD FOR PROCESSING ELECTRONIC PACKAGE

(71) Applicant: HUAWEI TECHNOLOGIES CO., LTD., Shenzhen (CN)

(72) Inventors: Hongbin Shi, Shanghai (CN); Zhuqiu Wang, Wuhan (CN); Runqing Ye, Shanghai (CN); Haohui Long, Beijing (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 3 days.

(21) Appl. No.: 16/958,565

(22) PCT Filed: Dec. 29, 2017

(86) PCT No.: PCT/CN2017/120076
§ 371 (c)(1),
(2) Date: Jun. 26, 2020

(87) PCT Pub. No.: WO2019/127448
PCT Pub. Date: Jul. 4, 2019

(65) Prior Publication Data
US 2020/0343210 A1 Oct. 29, 2020

(51) Int. Cl.
*H01L 23/00* (2006.01)
*H01L 21/48* (2006.01)
(Continued)

(52) U.S. Cl.
CPC .......... *H01L 24/14* (2013.01); *H01L 21/4853* (2013.01); *H01L 21/563* (2013.01);
(Continued)

(58) Field of Classification Search
CPC ....................................................... H01L 24/14
See application file for complete search history.

(56) References Cited

U.S. PATENT DOCUMENTS

| 7,256,503 B2 | 8/2007 | Daubenspeck et al. |
| 2003/0062618 A1 | 4/2003 | Xie et al. |

(Continued)

FOREIGN PATENT DOCUMENTS

| CN | 102097397 A | 6/2011 |
| CN | 102769009 A | 11/2012 |

(Continued)

*Primary Examiner* — William A Harriston
(74) *Attorney, Agent, or Firm* — Leydig, Voit & Mayer, Ltd.

(57) ABSTRACT

A device comprising a connecting plate and a circuit element is disclosed. The circuit element is electrically coupled to the connecting plate through a solder connection including a plurality of solder balls disposed between the circuit element and the connecting plate. An underfill layer is formed between the circuit element and the connecting plate and configured to provide bonding between the circuit element and the connecting plate. The solder connection includes a first solder area with a first solder ball density and a second solder area with a second solder ball density. The first solder ball density is less than the second solder ball density. The underfill layer includes a bonding material continuously disposed in the second solder area of the solder connection.

18 Claims, 4 Drawing Sheets

(51) Int. Cl.
*H01L 21/56* (2006.01)
*H01L 23/31* (2006.01)
*H01L 25/065* (2006.01)

(52) U.S. Cl.
CPC ...... *H01L 23/3157* (2013.01); *H01L 25/0657* (2013.01); *H01L 2224/14132* (2013.01); *H01L 2225/06513* (2013.01); *H01L 2225/06517* (2013.01); *H01L 2924/1432* (2013.01); *H01L 2924/18161* (2013.01)

(56) References Cited

U.S. PATENT DOCUMENTS

| | | |
|---|---|---|
| 2008/0176362 A1 | 7/2008 | Sengupta et al. |
| 2008/0277802 A1* | 11/2008 | Tsai ................ H01L 24/28 257/778 |
| 2013/0249106 A1 | 9/2013 | Lin et al. |
| 2015/0118801 A1 | 4/2015 | Harada et al. |

FOREIGN PATENT DOCUMENTS

| | | | |
|---|---|---|---|
| CN | 103050473 | A | 4/2013 |
| CN | 103871991 | A | 6/2014 |
| CN | 103887266 | A | 6/2014 |
| JP | 2000299356 | A | 10/2000 |
| JP | 2002016192 | A | 1/2002 |
| JP | 2010118634 | A | 5/2010 |
| WO | 2010109703 | A1 | 9/2010 |

* cited by examiner

ELECTRONIC PACKAGE, TERMINAL AND METHOD FOR PROCESSING ELECTRONIC PACKAGE

CROSS-REFERENCE TO RELATED APPLICATIONS

This application is a National Stage of International Application No. PCT/CN2017/120076, filed on 29 Dec. 2017, which is hereby incorporated by reference in its entirety.

TECHNICAL FIELD

The present invention relates to the field of electronics and information technologies, and in particular, to an electronic package, a terminal, and an electronic package processing method.

BACKGROUND

As a core element of portable electronic products such as a mobile phone, a smartwatch, and a tablet computer, an application processor (Application Processor, AP) has features such as high heat generation and a large size.

In addition, to ensure mechanical reliability of a solder ball in the AP when dropped (i.e., drop reliability), a low-silver LF35 (Sn/Ag1.2/Cu0.5/Ni0.05) solder with relatively poor temperature variation (including temperature shocking and temperature cycling) reliability is usually used as a solder ball material, and a reworkable high (high) coefficient of thermal expansion (Coefficient of Thermal Expansion, CTE) underfill (underfill) is filled between the AP and a printed circuit board (Printed Circuit Board, PCB), where this filling process is referred to as a dispensing process. However, filling of the high CTE underfill increases a risk of a temperature variation failure of the AP, and reduces the temperature variation reliability of the solder ball. Due to a relatively high temperature, the solder on the solder ball is thermally expanded, and the high CTE underfill around the solder ball is also thermally expanded. The two are squeezed by each other due to the expansion, and consequently the solder ball is deformed or even broken. As a result, the solder ball fails, that is, the temperature variation failure occurs, and the temperature variation reliability of the solder ball is reduced. Especially in a central position of the AP element with sparse solder balls, a ratio of the high CTE underfill is higher. Therefore, the high CTE underfill exerts a greater temperature variation force on the solder balls, and consequently the solder balls in the central area of the AP element fail. A white part in FIG. 1 indicates the solder balls that fail in the central area of the AP. FIG. 1 shows that the solder balls are broken.

In the prior art, for a product that has a relatively high drop reliability requirement, a high CTE underfill is usually 100% filled between a gap between an AP and a PCB. However, the high CTE underfill increases a risk of a temperature variation failure of the AP, that is, reduces temperature variation reliability of the solder balls, especially temperature variation reliability in the central position of the element with sparse solder balls.

SUMMARY

The present invention provides an electronic package, a terminal, and a method for processing an electronic package, so that both temperature variation reliability and mechanical reliability of a solder ball in a solder ball sparse area can be ensured.

According to a first aspect, the present invention provides an electronic package, including a circuit element, a connecting plate, connecting solder, and an underfill layer, where the circuit element includes a solder ball sparse area, a solder ball dense area, and an edge area, where the solder ball sparse area is located in a central area of the circuit element, the solder ball dense area surrounds the solder ball sparse area and is located on a periphery of the solder ball sparse area, and the edge area surrounds the solder ball dense area and is located on a periphery of the circuit element;

the connecting solder is connected between the circuit element and the connecting plate; and the underfill layer includes a dispensing area and a non-dispensing area, and the non-dispensing area includes the entire solder ball sparse area.

In the present invention, the underfill layer includes the dispensing area and the non-dispensing area, and the dispensing area includes at least a part of the edge area, to ensure relatively high mechanical reliability of the electronic package, so that the electronic package can meet a mechanical reliability requirement. In addition, the non-dispensing area includes at least the entire solder ball sparse area, that is, dispensing is not performed in the solder ball sparse area, so that temperature variation reliability of the electronic package can be improved. In this way, the electronic package in the present invention can improve the temperature variation reliability when relatively high mechanical reliability is ensured.

In an optional implementation, the dispensing area includes the entire edge area and the entire solder ball dense area; or the dispensing area includes the entire edge area and a part of the solder ball dense area, where the part of the solder ball dense area includes an area in which a plurality of most peripheral circles of solder balls are located on the circuit element.

In an optional implementation, the non-dispensing area is a circular area, and an edge of the circular area and an edge of the circuit element are separated by a plurality of rows of solder balls.

During dispensing, fluidity of a dispensing material is usually used to control a dispensing range. Therefore, during dispensing, the dispensing material may cause a deviation from an actual filling range. In this implementation, the part of the solder ball dense area includes an area in which the plurality of most peripheral circles of the solder balls are located on the circuit element. In this way, when a deviation is considered, the dispensing area may cover at least the area in which the most peripheral solder balls are located on the circuit element 201, to ensure that the mechanical reliability is not reduced when the dispensing area is at a minimum, and when the dispensing area is at a maximum, the dispensing area does not include the solder ball sparse area, that is, the temperature variation reliability of the solder ball is improved as much as possible.

In an optional implementation, the non-dispensing area is a polygon.

In an optional implementation, the circuit element is a central processing unit CPU core.

In an optional implementation, the connecting plate is a printed circuit board PCB, a package substrate, or a CPU core.

In an optional implementation, a silkscreen is disposed in a position that is on the connecting plate and that is corresponding to a boundary between the dispensing area and the non-dispensing area.

In an optional implementation, a groove is disposed in a position that is on the connecting plate and that is corresponding to the boundary between the dispensing area and the non-dispensing area.

In an optional implementation, no-flow adhesive is filled in the dispensing area of the underfill layer.

In an optional implementation, the dispensing area of the underfill layer of the circuit element is an area in which dispensing is performed in advance before solder paste printing.

In an optional implementation, a surface of the connecting plate is covered with a preformed underfiller, and the preformed underfiller coincides with the dispensing area.

According to a second aspect, the present invention provides a terminal, including any one of the foregoing electronic packages.

Furthermore, the present invention further provides two methods for processing an electronic package.

By using the method according to the present invention, precise control of a non-dispensing area is ensured, and mechanical reliability and temperature variation reliability of the electronic package are improved.

DESCRIPTION OF EMBODIMENTS

After a circuit element and a connecting plate are connected to each other and packaged, the circuit element and the connecting plate are referred to as an electronic package. Dispensing is required inside the electronic package to ensure mechanical reliability. In an embodiment of the present invention, an underfill layer disposed on between the circuit element and the connecting plate includes a dispensing area, and a non-dispensing area (i.e., a void), which includes at least a solder ball sparse area. In this way, temperature variation reliability of a solder ball in the solder ball sparse area can be improved. In addition, to ensure the mechanical reliability, the dispensing area includes at least a part of an edge area of the circuit element, so that both the temperature variation reliability and the mechanical reliability of the solder ball can be ensured.

Figure 1:
FIG. 1 is a schematic diagram of a failed solder ball in a central area of an AP.
Figure 2:
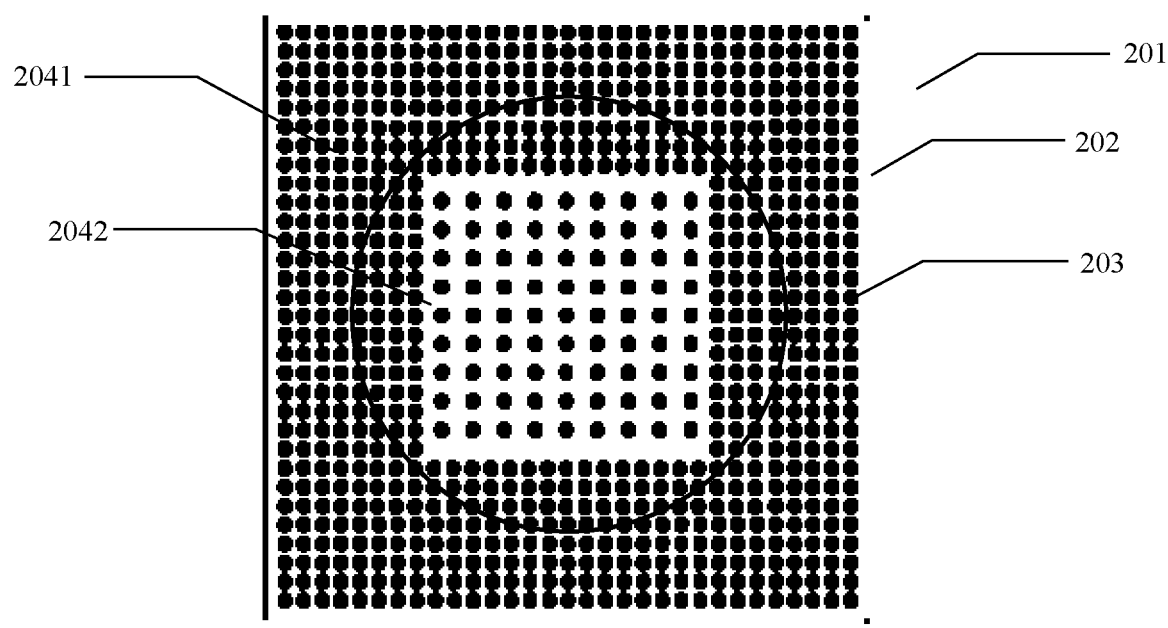
FIG. 2 is a schematic structural diagram of an electronic package according to an embodiment of the present invention.

FIG. 2 is a schematic structural diagram of an electronic package according to an embodiment of the present invention. As shown in FIG. 2, the electronic package according to this embodiment of the present invention specifically includes: a circuit element 201, a connecting plate 202, connecting solder or a solder connection 203, and an underfill layer (not shown in the figure).

The circuit element may be a central processing unit (central processing unit, CPU) core, and the connecting plate may be a PCB, a package substrate, or a CPU core. A solder ball is shown as a black spot, and the solder connection 203 a plurality of solder balls. An area in which there are dense solder balls (i.e, the density of the solder balls is relatively high), is referred to as a solder ball dense area. An area in which there are sparse solder balls (i.e., the density of the solder balls is relatively low), is referred to as a solder ball sparse area, and the solder ball sparse area is located in a central area of the circuit element 201. An area in which four edges of the circuit element 201 horizontally extend inward in FIG. 2 is referred to as an edge area. The edge area is variable, to be specific, the edge area includes at least an intersection point area of the four edges of the circuit element 201, that is, an area in which four corners of the circuit element 201 are located. The edge area may horizontally extend to the edges based on the intersection point area of the four edges. In general, the edge area is an area that resists greatest mechanical stress.

It can be learned that the solder ball dense area is an area located between the edge area and the solder ball sparse area, and surrounds the solder ball sparse area.

The underfill layer includes a dispensing area 2041 and a non-dispensing area 2042. The dispensing area 2041 is an area outside a circular area in FIG. 2. The dispensing area 2041 is an area filled with adhesive (i.e., a bonding material) continuously, and the adhesive may be a high CTE underfill, or may be a no-flow underfill (no-flow underfill). The no-flow underfill has poor fluidity. Therefore, the no-flow underfill is selected as a dispensing material. During a dispensing process, a dispensing range of may be effectively controlled to prevent the no-flow underfill from entering the non-dispensing area, and therefore, it can be better ensured that the no-flow underfill does not exist in the non-dispensing area, thereby improving temperature variation reliability of the solder ball.

Considering that performing dispensing in the edge area can ensure mechanical reliability, and for example, performing dispensing in the edge area may increase drop stress. The dispensing area 2041 may include at least a part of the edge area, and the current dispensing area may also include the entire edge area.

The non-dispensing area 2042 is an area inside the circular area in FIG. 2. The non-dispensing area is an area not filled with the adhesive. The non-dispensing area 2042 includes at least the entire solder ball sparse area. In this way, adhesive does not need to be filled in the non-dispensing area 2042, and therefore, the non-dispensing area 2042 is not affected by thermal expansion of the high CTE underfill under a relatively high temperature, so that the temperature variation reliability of the solder ball is enhanced.

Figure 3:
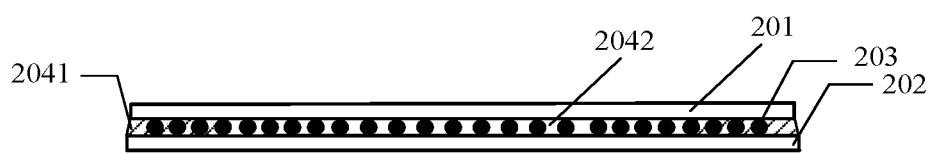
FIG. 3 is a schematic diagram of a dispensing area of an electronic package according to an embodiment of the present invention.

FIG. 3 is a schematic diagram of a cross section in a middle position of an electronic package in a dispensing manner shown in FIG. 2, where a shadow part is the dispensing area 2041. It can be learned from FIG. 3 that the non-dispensing area 2042 includes the entire solder ball sparse area.

In this embodiment of the present invention, in a working process of a circuit element, a temperature is relatively high in a solder ball sparse area, and consequently temperature variation reliability of a solder ball is relatively poor. To improve the temperature variation reliability of the solder ball sparse area, the non-dispensing area 2042 may include the entire solder ball sparse area, or the non-dispensing area 2042 may include the entire solder ball sparse area and a part of a solder ball dense area. Dispensing does not need to be performed in the non-dispensing area 2042, and without impact of adhesive, the temperature variation reliability of the solder ball is improved.

In an example, specifically, the dispensing area 2041 may include the entire edge area and the part of the solder ball dense area. The part of the solder ball dense area includes an area in which a plurality of most peripheral circles of solder balls are located on the circuit element 201. In other words, the dispensing area 2041 in FIG. 2 includes an area in which four most peripheral circles of solder balls are located on the circuit element 201.

During dispensing, a dispensing range is usually controlled by fluidity of a dispensing material. Therefore, during dispensing, the dispensing material may cause a deviation from an actual filling range. In general, for example, a deviation range may be a row of solder balls. Therefore, in this embodiment of the present invention, the dispensing area 2041 may include the area in which the four most peripheral circles of the solder balls are located on the circuit element 201, where the four most peripheral circles of the solder balls in the circuit element 201 are respectively marked from outside in as: a first circle of solder balls, a second circle of solder balls, a third circle of solder balls, and a fourth circle of solder balls.

In this way, when a deviation is considered, the dispensing area may cover at least an area in which three most peripheral circles of solder balls are located on the circuit element 201, and the dispensing area may cover a maximum area in which five most peripheral circles of solder balls are located on the circuit element 201, so that mechanical reliability is not reduced when the dispensing area is at a minimum, and when the dispensing area is at a maximum, the temperature variation reliability of the solder ball can be improved.

The non-dispensing area 2042 not only includes the entire solder ball sparse area, but also includes the part of solder ball dense area. In this way, dispensing does not need to be performed in the solder ball sparse area, and therefore the temperature variation reliability of the solder ball in the solder ball sparse area can be improved. Performing dispensing in the entire edge area and the part of the solder ball dense area may ensure the mechanical reliability, that is, increase the drop stress.

In an example, the non-dispensing area 2042 may be a circular area that includes the solder ball sparse area, and an edge of the circular area is separated from an edge of the circuit element 201 by a plurality of rows of solder balls.

As shown in FIG. 2, the dispensing area 2041 includes the edge area and the part of the solder ball dense area. The non-dispensing area 2042 is the circular area that includes the solder ball sparse area.

It should be noted that the edge of the circular area may be separated from the edge of the circuit element 201 by four rows of solder balls.

Figure 4:
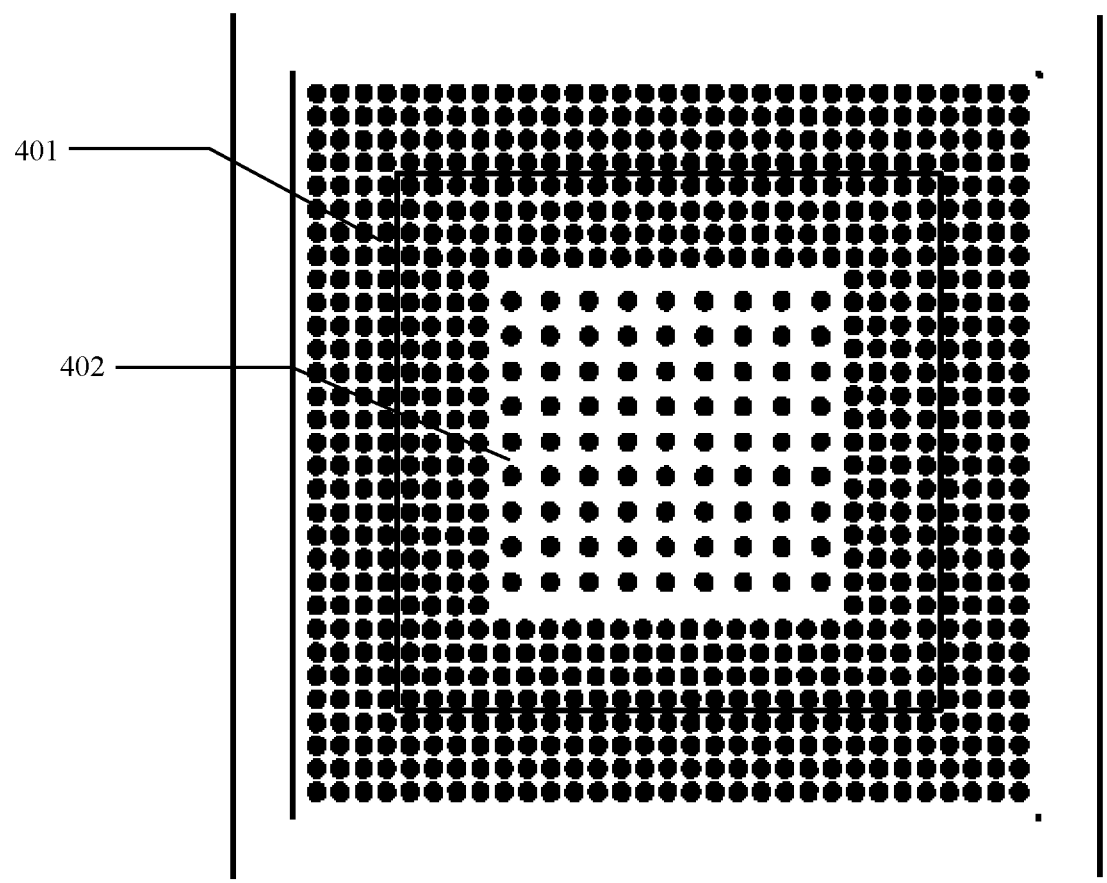
FIG. 4 is a schematic structural diagram of another electronic package according to an embodiment of the present invention.

FIG. 4 is a schematic structural diagram of another electronic package according to an embodiment of the present invention. As shown in FIG. 4, a dispensing area 401 includes an entire edge area and a part of a solder ball dense area; and a non-dispensing area 402 not only includes an entire solder ball sparse area, but also includes a part of the solder ball dense area. Dispensing does not need to be performed in the solder ball sparse area, and therefore, temperature variation reliability of a solder ball in the solder ball sparse area may be improved. Performing dispensing in the entire edge area and the part of the solder ball dense area may ensure the mechanical reliability, that is, increase the drop stress.

In an example in this embodiment of the present invention, specifically, the dispensing area 401 may include the entire edge area and the part of the solder ball dense area. The part of the solder ball dense area includes an area in which a plurality of most peripheral circles of solder balls are located on the circuit element 201. In other words, the dispensing area 401 in FIG. 4 includes an area in which four most peripheral circles of solder balls are located on the circuit element 201.

Compared with the dispensing area 401 shown in FIG. 4, the dispensing area 2041 shown in FIG. 2 has a larger dispensing range at four corners of the circuit element 201, so that mechanical reliability can be improved.

The mechanical reliability is measured by maximum drop stress. A greater maximum drop stress indicates a higher mechanical. The temperature variation reliability of the solder ball is measured by a maximum creep strain energy density. A lower maximum creep strain energy density indicates a higher temperature variation reliability of the solder ball.

In this embodiment of the present invention, that the connecting plate 202 specifically is a PCB is used as an example. The following compares, by using schematic diagrams of effects shown in FIG. 5(*a*) and FIG. 5(*b*), effects of a dispensing manner in the prior art, a dispensing manner in the embodiment shown in FIG. 2 of the present invention, and a dispensing manner in the embodiment shown in FIG. 4 of the present invention.

In the prior art, dispensing is performed on the entire circuit element 201.

The dispensing manner in the embodiment shown in FIG. 2 of the present invention is as follows: The dispensing area 2041 includes the edge area and the part of the solder ball dense area; and the non-dispensing area 2042 is the circular area that includes the entire solder ball sparse area and a part of the solder ball dense area, and the edge of the non-dispensing area 2042 is separated from the edge of the circuit element 201 by the four rows of solder balls.

The dispensing manner in the embodiment shown in FIG. 4 of the present invention is as follows: The dispensing area 401 includes the edge area and the part of the solder ball dense area; and the non-dispensing area 402 is a quadrilateral area that includes the entire solder ball sparse area and a part of the solder ball dense area, and the edge of the non-dispensing area 402 is separated from the edge of the circuit element 201 by the four rows of solder balls.

In FIG. 5(*a*) and FIG. 5(*b*), A represents the dispensing manner in the prior art, B represents the dispensing manner in the embodiment shown in FIG. 4 of the present invention, and C represents the dispensing manner in the embodiment shown in FIG. 2 of the present invention. In addition, in FIG. 5(*a*) and FIG. 5(*b*), A, B, and C each include two pieces of data, and the two pieces of data are respectively data on a circuit element 201 side and data on a PCB side. Refer to examples in the figures for details.

Figure 5A:
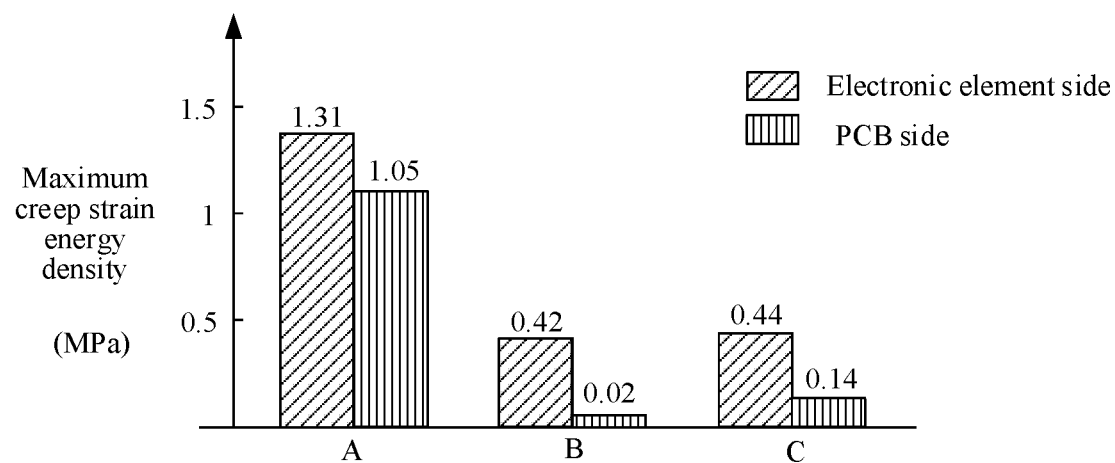
FIG. 5(a) is a schematic diagram of a technical effect of maximum creep strain energy density according to an embodiment of the present invention.

FIG. 5(a) shows maximum creep strain energy densities corresponding to the three dispensing manners A, B, and C on the circuit element 201 side and the PCB side. Specifically, as shown in FIG. 5(a), in the dispensing manner A, a maximum creep strain energy density on the circuit element 201 side is 1.31 MPa, and a maximum creep strain energy density on the PCB side is 1.05 MPa; in the dispensing manner B, a maximum creep strain energy density on the circuit element 201 side is 0.42 MPa, and a maximum creep strain energy density on the PCB side is 0.02 MPa; and in the dispensing manner C, a maximum creep strain energy density on a circuit element 201 side is 0.44 MPa, and a maximum creep strain energy density on a PCB side is 0.14 MPa.

Figure 5B:
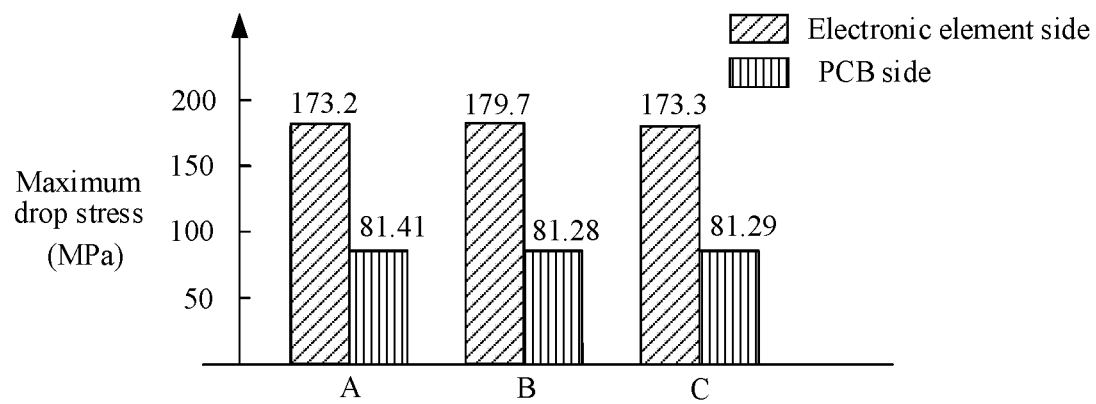
FIG. 5(b) is a schematic diagram of effect comparison of maximum drop stress according to an embodiment of the present invention.

FIG. 5(b) shows maximum drop stress corresponding to the three dispensing manners A, B, and C on the circuit element 201 side and the PCB side. Specifically, as shown in FIG. 5(a), in the dispensing manner A, maximum drop stress on the circuit element 201 side is 173.2 MPa, and maximum drop stress on the PCB side is 81.41 MPa; in the dispensing manner B, maximum drop stress on the circuit element 201 side is 179.7 MPa, and maximum drop stress on the PCB side is 81.28 MPa; and in the dispensing manner C, maximum drop stress on the circuit element 201 side is 173.3 MPa, and the maximum drop stress on the PCB side is 81.29 MPa.

As shown in the comparison diagram shown in FIG. 5(a), it can be learned that the maximum creep strain energy density in the dispensing manner in the embodiment shown in FIG. 4 of the present invention is lower than the maximum creep strain energy density in the dispensing manner in the embodiment shown in FIG. 2 of the present invention. This further indicates that the temperature variation reliability of the solder ball in the dispensing manner in the embodiment shown in FIG. 4 of the present invention is higher than the temperature variation reliability of the solder ball in the dispensing manner in the embodiment shown in FIG. 2 of the present invention. Therefore, it can be learned that a larger dispensing area indicates a higher maximum creep strain energy density and lower temperature variation reliability of the solder ball. However, compared with the dispensing manner in the prior art, the temperature variation reliability of the solder ball can be improved by using the dispensing manners in the embodiments of the present invention, and in particular, the dispensing manner in the embodiment shown in FIG. 4 of the present invention.

As shown in the comparison diagram shown in FIG. 5(b), maximum drop stress corresponding to the three dispensing manners A, B, and C is basically the same, that is, neither the dispensing manner in the embodiment shown in FIG. 4 of the present invention nor the dispensing manner in the embodiment shown in FIG. 2 of the present invention reduces the mechanical reliability.

It can be learned from the comparison diagrams shown in FIG. 5(a) and FIG. 5(b) that the dispensing manners in this embodiments of the present invention can improve the reliability of the temperature variation of the solder ball while ensuring the mechanical reliability.

In an embodiment of the present invention, the non-dispensing area is a polygon that includes the solder ball sparse area.

Figure 6:
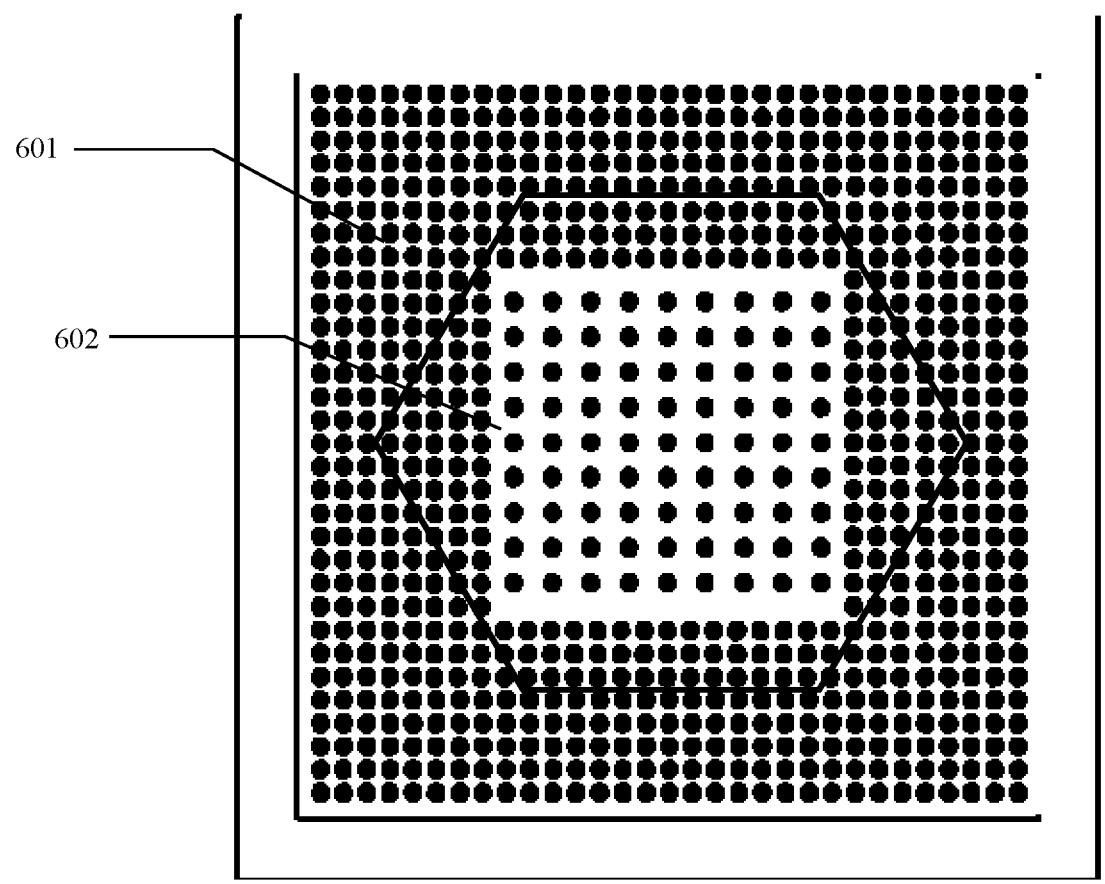
FIG. 6 is a schematic structural diagram of another electronic package according to an embodiment of the present invention.

FIG. 6 is a schematic structural diagram of another electronic package according to an embodiment of the present invention. As shown in FIG. 6, a dispensing area 601 includes an edge area and a part of a solder ball dense area. A non-dispensing area 602 is a polygon that includes an entire solder ball sparse area and a part of the solder ball dense area. The polygon in FIG. 6 may specifically be a regular hexagon.

An objective of this operation is that, in view of a high CTE of a high CTE underfill, dispensing may be performed only in a peripheral area of a device with a high mechanical risk, that is, the dispensing area 601, and dispensing is not performed in the solder ball sparse area. A shape of the solder ball sparse area in which dispensing is not performed may be a rectangle, a circle, a polygon, or the like.

The following describes the circuit element 201 and the connecting plate 202 with reference to specific embodiments.

In another embodiment of the present invention, the circuit element 201 is connected to the connecting plate 202 by using the solder connection 203. The circuit element 201 has features such as high heat generation and a large size. In an example, the circuit element 201 may be a CPU core (Die). A die is a chip cut from a wafer and has complete functions, and is generally several millimeters in size. A scolder pad or a hole for connecting a metal wire is disposed on an edge, and the metal wire is connected to an external pin or a scolder pad on a circuit board.

In an example, the connecting plate 202 may be a PCB. The PCB is an important electronic component, is a support body of electronic parts and components, and is a carrier for electrical connection of the electronic parts and components.

The die may be connected to the PCB by using the solder connection 203. Specifically, a solder ball dense area and a solder ball sparse area are disposed on the die, and the solder connection 203 specifically includes a plurality of solder balls.

In a running process of the die, a temperature of the solder ball sparse area is relatively high, and temperature variation reliability of the solder ball is relatively poor. Dispensing may be performed based on the dispensing area and the non-dispensing area in this embodiment of the present invention, so that the temperature variation reliability of the solder ball is improved while mechanical reliability of the die is ensured.

In an embodiment of the present invention, the circuit element 201 may be a die. The connecting plate 202 may be a package substrate (substrate). The package substrate may provide functions such as electrical connection, protection, support, heat dissipation, and assembly to the chip, to implement multi-pinization, reduce a size of a package product, improve electrical performance and heat dissipation performance, and achieve an ultra-high density or multi-chip modularization purpose.

The die and the substrate may be connected by using the solder connection 203. Specifically, a solder ball dense area and a solder ball sparse area are disposed on the die, and the solder connection 203 specifically is located on the solder ball. In a running process of the die, a temperature of the solder ball sparse area is relatively high, and temperature variation reliability of the solder ball is relatively poor. Dispensing may be performed based on the dispensing area and the non-dispensing area in this embodiment of the present invention, so that the temperature variation reliability of the solder ball is improved while mechanical reliability of the die is ensured.

In an embodiment of the present invention, the circuit element 201 may be a die, and the connecting plate 202 may also be a die.

The dies may be connected by using solder connection 203. Specifically, a solder ball dense area and a solder ball sparse area are disposed on the die, and the solder connection 203 specifically is located on the solder ball. In a running process of the die, a temperature of the solder ball sparse area is relatively high, and temperature variation reliability of the solder ball is relatively poor. Dispensing may be performed based on the dispensing area and the non-dispensing area in this embodiment of the present invention, so that the temperature variation reliability of the solder ball is improved while mechanical reliability of the die is ensured.

Figure 7:
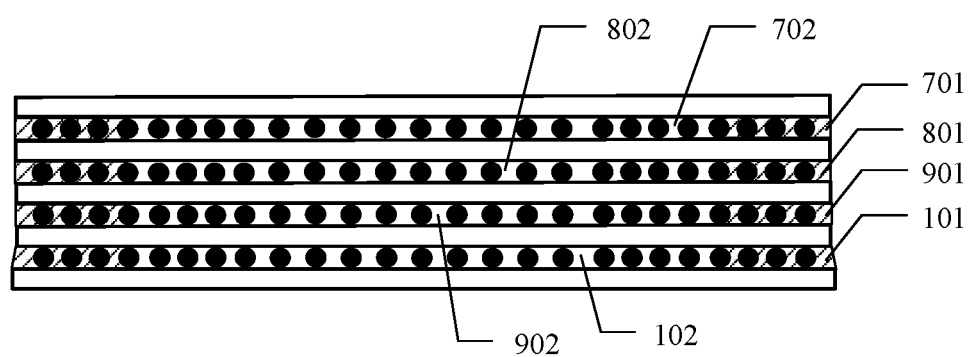
FIG. 7 is a schematic diagram of a dispensing area of an electronic package according to an embodiment of the present invention.

FIG. 7 is a schematic diagram of a dispensing manner of an electronic package according to an embodiment of the present invention. As shown in FIG. 7, the package has five layers in total namely, a first layer is a substrate, a second layer is a main control die, and third to fifth layers are secondary dies from the bottom to the top.

The substrate at the first layer is connected to the main control die at the second layer by using a solder connection including a plurality of solder balls on a solder ball; Correspondingly, the main control die at the second layer is connected to the secondary die at the third layer by using a solder connection including a plurality of solder balls; the secondary die at the third layer is connected to the secondary die at the fourth layer by using a solder connection including a plurality of solder balls; and the secondary die at the fourth layer is connected to the secondary die at the fifth layer by using a solder connection including a plurality of solder balls. Each layer of solder balls includes a solder ball sparse area and a solder ball dense area, an underfill layer shown in FIG. 2 is included between the layers, and the underfill layer includes a dispensing area and a non-dispensing area.

In this way, the substrate at the first layer may connect to the die at each layer by using the solder ball between the substrate at the first layer and the main control die at the second layer, a solder ball between the main control die at the second layer and the sub-die at the third layer, a solder ball between the secondary die at the third layer and the sub-die at the fourth layer, and a solder ball between the sub-die at the fourth layer and the sub-die at the fifth layer. Dispensing manners in the foregoing embodiments of the present invention may be used for dispensing between layers.

FIG. 7 is a schematic diagram of a cross section in a middle position of an electronic package when each layer uses a dispensing manner according to the embodiment shown in FIG. 2 of the present invention, where a shadow part is a dispensing area. As shown in FIG. 7, between the first layer and the second layer, a dispensing area is 101 and a non-dispensing area is 102; between the second layer and the third layer, a dispensing area is 901 and a non-dispensing area is 902; between the third layer and the fourth layer, a dispensing area is 801 and a non-dispensing area is 802; and between the fourth layer and the fifth layer, a dispensing area is 701 and a non-dispensing area is 702.

In other words, in actual application, the electronic package may include a plurality of circuit elements and a plurality of connecting plates. The plurality of circuit elements and the plurality of connecting plates are stacked, and the circuit elements and the connecting plates are connected by using a solder connection of solder balls. The technical solutions in the embodiments of the present invention may be applied to the underfill layer. In a running process of the die, a temperature of a solder ball sparse area at each layer is relatively high, and temperature variation reliability of the solder ball is relatively poor. Dispensing may be performed based on the dispensing area and the non-dispensing area in this embodiment of the present invention, so that the temperature variation reliability of the solder ball is improved while mechanical reliability of the entire electronic package is ensured.

In an embodiment of the present invention, a terminal is further disclosed. The terminal may include the foregoing electronic package.

The present invention further provides a method for processing an electronic package, where a circuit element includes a solder ball sparse area, a solder ball dense area, and an edge area, where the solder ball sparse area is located in a central area of the circuit element, the solder ball dense area surrounds the solder ball sparse area and is located on a periphery of the solder ball sparse area, and the edge area surrounds the solder ball dense area and is located on a periphery of the circuit element. The method includes: disposing a blocking structure around a periphery of a preset area of a connecting plate, and a projection of the preset area on the circuit element covers the entire solder ball sparse area; connecting the connecting plate and the circuit element by using a solder connection; and dispensing adhesive on a periphery between the connecting plate and the circuit element.

The blocking structure is disposed around the periphery of the preset area of the connecting plate, and consequently after the connecting plate is connected to the circuit element, a dispensing process can be accurately controlled, and the blocking structure can prevent adhesive from entering a non-dispensing area, thereby improving mechanical reliability and temperature variation reliability of the electronic package.

The blocking structure includes a silkscreen, a groove, or combination of a silkscreen and a no-flow adhesive.

Specifically, the connecting plate is, for example, a PCB. A PCB silkscreen may be disposed in a position in which the dispensing area and the non-dispensing area are connected in the PCB. The PCB is a structural element including an insulating material and a conductor wiring. When a final product is manufactured, an integrated circuit, a transistor, a diode, a passive element (for example, a resistor, a capacitor, or a connector), and other electronic components are installed on the PCB. A silkscreen layer is a text layer, which is a top layer of the PCB.

In this embodiment of the present invention, PCB silkscreen interception may be used during dispensing at the underfill layer. The PCB silkscreen may limit adhesive flowing. In this way, dispensing may be performed in the dispensing area obtained after interception, and dispensing does not need to be performed in the non-dispensing area of the underfill layer.

Optionally, a groove is disposed around a periphery of the preset area of the connecting plate, so that the groove surrounds the preset area and corresponds to a periphery of the non-dispensing area on the circuit element. Dispensing is performed in the dispensing area at the underfill layer by storing adhesive in the groove.

In this embodiment of the present invention, corresponding to the dispensing area at the underfill layer, the groove may be disposed on the connecting plate. When dispensing is performed in the dispensing area, adhesive that exceeds the dispensing area may be stored in the groove, so that the adhesive does not enter the non-dispensing area. This further ensures that there is no adhesive in the non-dispensing area.

Optionally, a silkscreen may be first disposed on a periphery of the preset area of the connecting plate, and no-flow adhesive is disposed on the silkscreen, so that it can be ensured that the adhesive does not enter the non-dispensing area.

This embodiment of the present invention further provides another method for processing an electronic package, where a circuit element includes a solder ball sparse area, a solder ball dense area, and an edge area, the solder ball sparse area is located in a central area of the circuit element, the solder ball dense area surrounds the solder ball sparse area and is located on a periphery of the solder ball sparse area, and the edge area surrounds the solder ball dense area and is located on a periphery of the circuit element. The method specifically includes: disposing a pre-dispensing area around a periphery of the preset area of the connecting plate, where a projection of the preset area on the circuit element covers the entire solder ball sparse area; and connecting the connecting plate and the circuit element by using connecting solder.

The pre-dispensing area is disposed around the periphery of the preset area of the connecting plate, so that accuracy of a range of the non-dispensing area is ensured, and mechanical reliability and temperature variation reliability of the electronic package are improved.

Specifically, the pre-dispensing area is disposed in the dispensing area at the underfill layer of the circuit element. The pre-dispensing area may be an area in which dispensing is performed in advance before solder paste printing, or an underfiller.

In general, solder paste printing is first performed on the circuit element to form a solder ball, and then electronic parts and components are inserted into the solder ball. After dispensing is performed in the dispensing area at the underfill layer, the electronic package is obtained through solidification.

In an example, dispensing may be performed in the dispensing area at the underfill layer of the circuit element, so that the adhesive is solidified on the circuit element, and then solder paste printing is performed to form a solder ball, so that the circuit element is welded to the connecting plate 202, and an electronic package is obtained through solidification. A printing process will undergo a high temperature. Therefore, the adhesive solidified on the circuit element is converted into a liquid state, and may be connected to the connecting plate 202. After the electronic package is obtained through solidification, the adhesive is also solidified, to complete a dispensing process in the dispensing area.

Optionally, the connecting plate 202 is covered with the underfill layer, the underfill layer includes a preformed underfiller, and the preformed underfiller coincides with the dispensing area.

To avoid directly performing dispensing in the dispensing area of the underfill layer on the circuit element, a preformed underfiller may be generated in advance based on the dispensing area of the underfill layer. In other words, the preformed underfiller coincides with the dispensing area, and the preformed underfiller may be a solidified dispensing material. Then the preformed underfiller covers the connecting plate 202. In this way, in a high-temperature printing process, the preformed underfiller is converted into a liquid state, and may be connected to the circuit element 201. After the electronic package is obtained through solidification, the adhesive is also solidified, to complete a dispensing process in the dispensing area. In this way, when the adhesive is dispensed in the dispensing area, the adhesive may be prevented from entering the non-dispensing area.

The foregoing descriptions are merely specific implementations of the present invention, but are not intended to limit the protection scope of the present invention. Any variation or replacement readily figured out by a person skilled in the art within the technical scope disclosed in the present invention shall fall within the protection scope of the present invention. Therefore, the protection scope of the present invention shall be subject to the protection scope of the claims.

What is claimed is:

1. A device comprising:
    a connecting plate;
    a circuit element electrically coupled to the connecting plate through a solder connection including a plurality of solder balls disposed between the circuit element and the connecting plate;
    an underfill layer formed between the circuit element and the connecting plate and configured to provide bonding between the circuit element and the connecting plate, wherein the solder connection includes a first solder area with a first solder ball density and a second solder area with a second solder ball density, and wherein the first solder ball density is less than the second solder ball density,
    the underfill layer includes a bonding material continuously disposed in the second solder area of the solder connection and a void in which the bonding material is not disposed,
    wherein the void of the underfill layer includes the first solder area of the solder connection, and
    the connecting plate further includes a silkscreen disposed thereon and associated with a boundary of the void of the underfill layer.

2. The device of claim 1, wherein the second solder area of the solder connection encloses the first solder area of the solder connection.

3. The device of claim 2, wherein the bonding material of the underfill layer is configured to enclose the first solder area of the solder connection.

4. The device of claim 1, wherein the bonding material is continuously disposed in at least a half of the second solder area.

5. The device of claim 4, wherein the bonding material is disposed in the entire second solder area.

6. The device of claim 1, wherein the void of the underfill layer has a circular shape or a polygonal shape.

7. The device of claim 1, wherein the circuit element includes a plurality of edges, and an edge of the void of the underfill layer is separated from an edge of the circuit element by a plurality of rows of solder balls.

8. The device of claim 1, wherein the circuit element is a central processing unit (CPU).

9. The device of claim 1, wherein the connecting plate is a printed circuit board (PCB).

10. The device of claim 1, wherein the connecting plate further includes a groove disposed thereon and associated with the boundary of the void of the underfill layer.

11. The device of claim 1, wherein the bonding material includes a no-flow adhesive.

12. The device of claim 1, wherein the bonding material of the underfill layer is dispensed before solder paste printing.

13. The device of claim 1, wherein the underfill layer includes an underfiller of the bonding material and a preconfigured shape having the void.

14. The device of claim 1, wherein the first solder area corresponds to a central area of the circuit element.

15. A method of electronic packaging, the method comprising:
    disposing a blocking structure on a connecting plate around a preset area of the connecting plate;

connecting, by a solder connection, the connecting plate and a circuit element,
  wherein the solder connection includes a plurality of solder balls disposed between the circuit element and the connecting plate,
  wherein the solder connection further includes a first solder area with a first solder ball density and a second solder area with a second solder ball density,
  wherein the first solder ball density is less than the second solder ball density, and
  wherein the first solder area is aligned with the preset area of the connecting plate;
dispensing a bonding material continuously between the connecting plate and the circuit element in the second solder area of the solder connection while leaving a void in which the bonding material is not disposed, wherein the void includes the first solder area of the solder connection, and
disposing a silkscreen on the connecting plate, wherein the silkscreen is associated with a boundary of the void.

16. The method according to claim 15, wherein the blocking structure comprises one of: a silkscreen, a groove, or a combination of the silkscreen and no-flow adhesive.

17. A method of electronic packaging, the method comprising:
disposing a bonding material around a periphery of a preset area of a connecting plate while leaving a void in which the bonding material is not disposed, wherein the void includes a first solder area of a solder connection;
connecting, by the solder connection, the connecting plate and a circuit element,
  wherein the solder connection includes a plurality of solder balls disposed between the circuit element and the connecting plate,
  wherein the solder connection includes the first solder area with a first solder ball density and a second solder area with a second solder ball density,
  wherein the first solder ball density is less than the second solder ball density, and
  wherein the first solder area is aligned with the preset area of the connecting plate; and
disposing a silkscreen on the connecting plate, wherein the silkscreen is associated with a boundary of the void.

18. The method according to claim 17, wherein the bonding material includes an adhesive or an underfiller.

* * * * *